(12) United States Patent
Byun et al.

(10) Patent No.: US 9,935,184 B2
(45) Date of Patent: Apr. 3, 2018

(54) ELECTRONIC DEVICE INCLUDING A TUNNELING LAYER

(71) Applicant: Samsung Electronics Co., Ltd., Suwon-Si, Gyeonggi-Do (KR)

(72) Inventors: Kyungeun Byun, Uijeongbu-si (KR); Jisoo Kyoung, Seoul (KR); Seongjun Park, Seoul (KR); Hyeonjin Shin, Suwon-si (KR); Hyunjae Song, Hwaseong-si (KR); Jaeho Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 14/528,338

(22) Filed: Oct. 30, 2014

(65) Prior Publication Data

US 2015/0155374 A1 Jun. 4, 2015

(30) Foreign Application Priority Data

Nov. 29, 2013 (KR) .................. 10-2013-0147524

(51) Int. Cl.
| | |
|---|---|
| *H01L 31/072* | (2012.01) |
| *H01L 31/109* | (2006.01) |
| *H01L 31/0328* | (2006.01) |
| *H01L 31/0336* | (2006.01) |
| *H01L 29/66* | (2006.01) |
| *H01L 29/78* | (2006.01) |
| *H01L 29/45* | (2006.01) |

(52) U.S. Cl.
CPC ...... *H01L 29/66977* (2013.01); *H01L 29/456* (2013.01); *H01L 29/78* (2013.01)

(58) Field of Classification Search
CPC . H01L 29/66977; H01L 29/267; H01L 29/78; H01L 27/11543; H01L 29/66151; H01L 29/66219; H01L 29/66931; H01L 29/7311
USPC ................. 257/192, 324, E29.309, E21.294; 365/185.28, 185.18, 185.29
See application file for complete search history.

(56) References Cited

U.S. PATENT DOCUMENTS

| | | | |
|---|---|---|---|
| 8,522,115 B2 * | 8/2013 | Kim .................... G06F 11/1068 365/185.17 |
| 2003/0118914 A1 * | 6/2003 | Mori ............................. 429/340 |
| 2006/0284165 A1 * | 12/2006 | Berger et al. ................... 257/25 |
| 2007/0218578 A1 * | 9/2007 | Lee ................... H01L 27/14647 438/48 |

(Continued)

FOREIGN PATENT DOCUMENTS

WO   WO 2014/008453   *   7/2013

OTHER PUBLICATIONS

Kalantar-Zadeh ; CMOS Emerging Technologies Research, Jul. 2013, p. 21.*

(Continued)

*Primary Examiner* — Duy T Nguyen
*Assistant Examiner* — Dilinh Nguyen
(74) *Attorney, Agent, or Firm* — Harness, Dickey & Pierce, P.L.C.

(57) ABSTRACT

An electronic device includes a semiconductor layer, a tunneling layer formed of a material including a two-dimensional (2D) material so as to directly contact a certain region of the semiconductor layer, and a metal layer formed on the tunneling layer.

8 Claims, 6 Drawing Sheets

(56) References Cited

U.S. PATENT DOCUMENTS

| | | | |
|---|---|---|---|
| 2008/0251836 A1* | 10/2008 | Park | H01L 29/66833 |
| | | | 257/324 |
| 2009/0175089 A1* | 7/2009 | Eitan | G11C 16/0475 |
| | | | 365/185.28 |
| 2010/0320510 A1 | 12/2010 | Loh et al. | |
| 2012/0235118 A1 | 9/2012 | Avouris et al. | |
| 2012/0241752 A1 | 9/2012 | Wang et al. | |
| 2013/0032777 A1 | 2/2013 | Yin et al. | |
| 2013/0075700 A1 | 3/2013 | Yang et al. | |
| 2013/0233380 A1* | 9/2013 | Zhao | H01L 31/02167 |
| | | | 136/256 |
| 2014/0061762 A1* | 3/2014 | Terai et al. | 257/324 |
| 2014/0124738 A1* | 5/2014 | Hamilton | H01L 29/1606 |
| | | | 257/29 |
| 2014/0158989 A1 | 6/2014 | Byun et al. | |
| 2014/0284552 A1* | 9/2014 | Kub | H01L 29/66242 |
| | | | 257/26 |

OTHER PUBLICATIONS

Manish Chhowalla et al.,"The Chemistry of two-dimensional layered transition metal dichalcogenide nanosheets," Nature Chemistry, Mar. 2013, vol. 5, pp. 263-275, Macmillan Publishers Limited.
Kobayashi, Masaharu, et al., "Fermi level depinning in metal/Ge Schottky junction for metal source/drain Ge metal-oxide-semiconductor field-effect-transistor application," Journal of Applied Physics, Vo. 105, 2009, pp. 023702-1-023702-6.

\* cited by examiner

ELECTRONIC DEVICE INCLUDING A TUNNELING LAYER

RELATED APPLICATIONS

This application claims priority from Korean Patent Application No. 10-2013-0147524, filed on Nov. 29, 2013, in the Korean Intellectual Property Office, the disclosure of which is incorporated herein in its entirety by reference.

BACKGROUND

1. Field

Example embodiments relate to electronic devices, and more particularly, to electronic devices configured to reduce a contact resistance of a portion at which a metal and a semiconductor meet.

2. Description of the Related Art

When a metal is junctioned, adjoined or coupled to a semiconductor, such as silicon, a Schottky energy barrier is generated due to a work function difference between the two materials and a Fermi-level pinning phenomenon of the work function of the metal on the surface of the silicon. In this case, a contact resistance between the metal and the silicon increases, thereby resulting in an increase in an operating voltage and consumption as thermal energy, and thus it is difficult to use the metal-silicon junction. Therefore, in order to solve the generation of the Schottky energy barrier, for generally used metal oxide silicon field effect transistors (MOSFETs), a junction is formed by increasing doping density at a silicon side, and a metal is junctioned, adjoined or coupled to the silicon.

However, according to the principle of MOSFET, a device design for preventing a junction leakage current by forming a p-n junction diode form with a substrate having low doping density is preferred. In addition, when a device size decreases, doping portions of a source and a drain meet each other, thereby resulting in a short channel effect such that a channel is not normally formed and causing a decrease in a device characteristic.

As another method of reducing the contact resistance between a metal and a semiconductor, pinning is prevented by generating a thin oxide on an interface between the metal and the semiconductor. However, it is typically difficult to uniformly generate a thin oxide layer, and if the thickness of the thin oxide layer is thick to a certain level, a contact resistance increases.

SUMMARY

At least one example embodiment relates to an electronic device and a transistor improved to reduce a contact resistance of a portion at which a metal and a semiconductor meet.

Additional example embodiments will be set forth in part in the description which follows and, in part, will be apparent from the description, or may be learned by practice of the presented embodiments.

According to an example embodiment, an electronic device includes a semiconductor layer, a tunneling layer formed of a material including a two-dimensional (2D) material so as to directly contact a certain region of the semiconductor layer, and a metal layer formed on the tunneling layer.

The tunneling layer may be formed of a 2D material so as to pass electrons therethrough.

The tunneling layer may be formed of a 2D laminated transition metal chalcogenide nanosheet.

The tunneling layer may include at least one layer of a plate-shaped structure material including a combination of at least one of titanium (Ti), zirconium (Zr), hafnium (Hf), vanadium (V), niobium (Nb), tantalum (Ta), molybdenum (Mo), tungsten (W), technetium (Tc), rhenium (Re), cobalt (Co), rhodium (Rh), iridium (Ir), nickel (Ni), palladium (Pd), and platinum (Pt), and at least one of sulfur (S), selenium (Se), and tellurium (Te).

The tunneling layer may include at least one layer of a plate-shaped structure material including a hexagonal boron nitride (h-BN).

The tunneling layer may include a dopant capable of changing a Fermi level of a plate-shaped structure material.

The semiconductor layer may be formed so as to uniformly have a constant doping density or to have a doping density that is about 1019 $cm^{-3}$ or less in a region of the semiconductor layer directly contacting the tunnel layer formed of a two-dimensional (2D) material.

The semiconductor layer may be a semiconductor substrate.

The semiconductor layer may include at least one of silicon, germanium, silicon-germanium, II-VI group semiconductors, and III-V group semiconductors.

The semiconductor layer may be weakly doped, e.g., a doping density of $10^{19}$ $cm^{-3}$ or less.

According to another example embodiment, a transistor includes a semiconductor layer including a channel region, first and second tunneling layers formed on the semiconductor layer so as to be separated from each other and directly contact the semiconductor layer and including a two-dimensional (2D) material, a source electrode and a drain electrode respectively formed on the first and second tunneling layers, and a gate electrode located to face the channel region.

The first and second tunneling layers may be formed of a 2D material so as to pass electrons therethrough.

The first and second tunneling layers may be formed of a 2D laminated transition metal chalcogenide nanosheet.

The first and second tunneling layers may include at least one layer of a plate-shaped structure material including a combination of at least one of titanium (Ti), zirconium (Zr), hafnium (Hf), vanadium (V), niobium (Nb), tantalum (Ta), molybdenum (Mo), tungsten (W), technetium (Tc), rhenium (Re), cobalt (Co), rhodium (Rh), iridium (Ir), nickel (Ni), palladium (Pd), and platinum (Pt) and at least one of sulfur (S), selenium (Se), and tellurium (Te).

The first and second tunneling layers may include at least one layer of a plate-shaped structure material including a hexagonal boron nitride (h-BN).

The first and second tunneling layers may include a dopant capable of changing a Fermi level of a plate-shaped structure material.

The transistor may further include a gate insulating layer located between the channel region and the gate electrode.

BRIEF DESCRIPTION OF THE DRAWINGS

These and/or other example embodiments will become apparent and more readily appreciated from the following description, taken in conjunction with the accompanying drawings in which.

DETAILED DESCRIPTION

Figure 1:
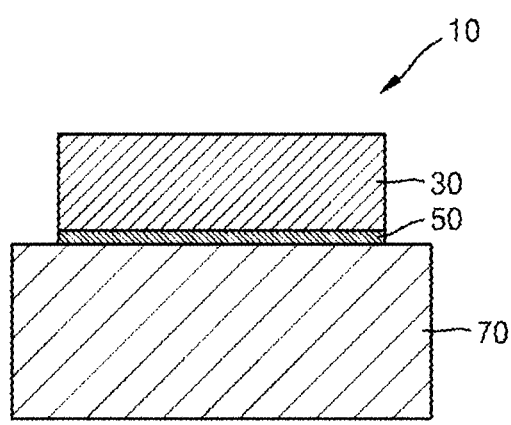
FIG. 1 is a schematic cross-sectional view of an electronic device according to an example embodiment.

An electronic device and a transistor, of which an energy barrier between a semiconductor substrate and a metal is reduced using graphene, according to example embodiments will now be described in detail with reference to the accompanying drawings. In the drawings, like reference numerals refer to like elements throughout, and the sizes, the thicknesses, and the like of components in the drawings may be exaggerated for clarity and convenience of description. In addition, when it is described that a certain component is "above," "on the upper part of," or "on" another component, the certain component may be directly above another component, or a third component may be interposed therebetween. In this regard, the example embodiments may have different forms and should not be construed as being limited to the descriptions set forth herein. Accordingly, the example embodiments are merely described below, by referring to the figures, to explain example embodiments of the present description. As used herein, expressions such as "at least one of," when preceding a list of elements, modify the entire list of elements and do not modify the individual elements of the list.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

On an interface between a metal and a semiconductor, a Fermi level of the metal has a particular value, thereby resulting in a Schottky energy barrier. The Schottky energy barrier may be expressed by a difference between a work function of the metal and an electron affinity of the semiconductor, and a Fermi-level pinning phenomenon is generated in many semiconductor-metal junctions such that the Schottky energy barrier is larger than predicted. The Schottky energy barrier causes a large resistance in a semiconductor-metal junction.

In general semiconductor processes, a depletion width (w) is reduced through implantation on a metal-silicon interface so that electrons pass more easily through the Schottky energy barrier. For the silicon, in order to reduce the depletion width to about 3 nm, opposite-polar doping of about $10^{19}$ cm$^{-3}$ on a source and drain portion may be preferred.

According to one or more example embodiments, a structure in which Fermi-level pinning of a semiconductor is changed using a two-dimensional (2D) material, and in which electrons pass through a thin 2D material is provided. Accordingly, the magnitude of the Schottky energy barrier between a metal and the semiconductor may be reduced, thereby resulting in a low-resistance metal-semiconductor junction. A device for gating a channel through the junction may be manufactured by an additional process.

FIG. 1 is a schematic cross-sectional view of an electronic device 10 according to an example embodiment.

Referring to FIG. 1, the electronic device 10 according to an example embodiment may include a semiconductor layer 70, a tunneling layer 50, and a metal layer 30.

According to at least one example embodiment, the semiconductor layer 70 may be a semiconductor substrate itself or may be a semiconductor layer formed on a semiconductor substrate (not shown). The semiconductor layer 70 may include at least one of, for example, silicon, germanium, silicon-germanium, II-VI group semiconductors, and III-V group semiconductors.

The semiconductor layer 70 may have a uniform doping density. Substantially all of the semiconductor layer 70 may be, for example, relatively weakly doped in an n-type, e.g. having a doping density of $10^{19}$ cm$^{-3}$ or less. For example, the semiconductor layer 70 may be a relatively weakly doped n-type silicon layer or silicon substrate. "Relatively weakly doped" indicates a weaker doping level than a typical doping level used to form a source region and a drain region. The semiconductor layer 70 may have a certain region in which the tunneling layer 50 is contact-formed. The certain region in which the tunneling layer 50 is contact-formed may have a doping density that is different from other regions of the semiconductor layer 70.

That is, the semiconductor layer 70 may have a uniform doping density, i.e., may be formed so as to have a uniform doping density without a separate doping process for the certain region in which the tunneling layer 50 is contact-formed. The certain region in which the tunneling layer 50 is contact-formed may have a doping density that is different from other regions of the semiconductor layer 70. In this case, the certain region in which the tunneling layer 50 is contact-formed may be formed so as to have a doping density that is $10^{19}$ cm$^{-3}$ or less.

The tunneling layer 50 may be formed on the semiconductor layer 70 so as to directly contact the certain region of the semiconductor layer 70. The tunneling layer 50 may be formed of a 2D material so as to pass electrons therethrough.

For example, the tunneling layer 50 may be formed of a two-dimensional (2D) laminated transition metal chalcogenide nanosheet. The tunneling layer 50 may include at least one layer of a plate-shaped structure material including a combination of at least one of titanium (Ti), zirconium (Zr), hafnium (Hf), vanadium (V), niobium (Nb), tantalum (Ta), molybdenum (Mo), tungsten (W), technetium (Tc), rhenium (Re), cobalt (Co), rhodium (Rh), iridium (Ir), nickel (Ni), palladium (Pd), and platinum (Pt), and at least one of sulfur (S), selenium (Se), and tellurium (Te).

The tunneling layer 50 may include at least one layer of a plate-shaped structure material including a hexagonal boron nitride (h-BN).

The tunneling layer 50 may include a dopant capable of changing a Fermi level of the plate-shaped structure material.

The metal layer 30 may be formed on the tunneling layer 50. The metal layer 30 may be formed of a metal, a metal alloy, a conductive metal oxide, a conductive metal nitride or the like usable as a metal electrode. For example, the metal layer 30 may include at least one of aluminum (Al), gold (Au), silver (Ag), beryllium (Be), bismuth (Bi), Co, copper (Cu), Hf, indium (In), manganese (Mn), Mo, Ni, lead (Pb), Pd, Pt, Rh, Re, ruthenium (Ru), Ta, Te, Ti, W, zinc (Zn), and Zr. The metal layer 30 may be formed by depositing such material(s) on the tunneling layer 50 in a single-layer or multi-layer structure.

According to the example electronic device 10 having a semiconductor-2D material-metal stacked structure as described above, pinning may be changed. Accordingly, a Schottky energy barrier between the metal and the semiconductor may be removed or dramatically reduced, thereby resulting in an ohmic contact between the semiconductor, e.g., silicon, and the metal.

That is, with the metal and the 2D material having a work function that is similar to the work function of the semiconductor, an ohmic contact on the semiconductor may be achieved by using the 2D material as a junction.

According to the example electronic device 10, instead of additional doping of opposite polarity to a channel region in a portion where the metal and the semiconductor meet, e.g., in source and drain regions for a transistor, an energy barrier may be lowered using the 2D material, and thus, an ohmic contact between the semiconductor, such as silicon, and the metal may be achieved without an additional implantation process, and the electronic device 10 may be turned on/off by gating the semiconductor.

For silicon, in order to reduce a depletion width to about 3 nm, it is recommended that opposite-polar doping of $10^{19}$ cm$^{-3}$ or more is performed on a source or drain portion. According to the electronic device 10 and a transistor according to one or more example embodiments, a structure in which Fermi-level pinning of a semiconductor is changed using a 2D material and electrons pass through a thin 2D material is provided, and thus a low-resistance metal-semiconductor junction may be achieved. A device for gating a channel through the junction may be manufactured.

The semiconductor-2D material-metal stacked structure may be applied to some or all metal-semiconductor junction devices in which a Schottky energy barrier is generated with various metals. Therefore, the technique of the electronic device 10 having the semiconductor-2D material-metal stacked structure, according to an example embodiment, may be applied to various metal-semiconductor junction devices.

Hereinafter, several comparison examples of band structures of a metal-silicon interface will be compared with the electronic device 10 according to an example embodiment.

Figure 2A:
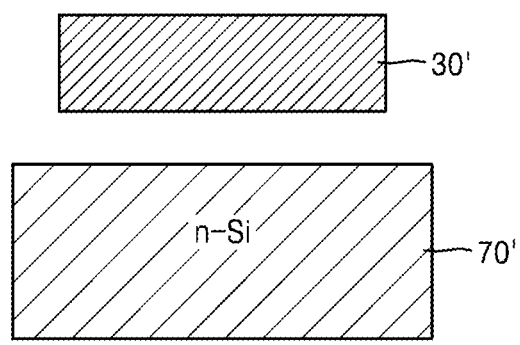
FIG. 2A illustrates a structure in which a metal layer is separated from a semiconductor layer, e.g., an n-type silicon (n-Si) layer.
Figure 2B:
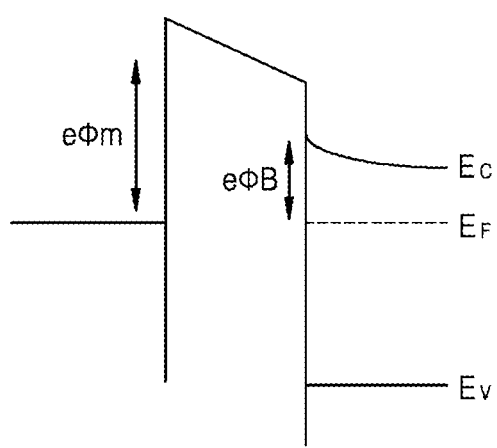
FIG. 2B illustrates a band diagram in the structure of FIG. 2A.
Figure 3A:
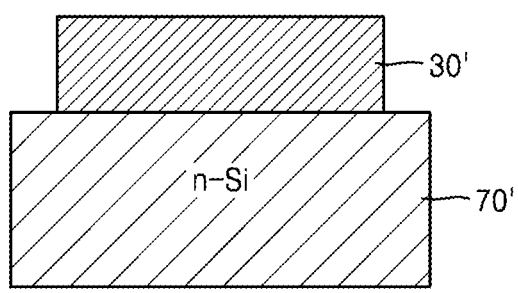
FIG. 3A illustrates a structure in which the metal layer is junctioned, adjoined or coupled to the semiconductor layer, e.g., the n-Si layer.
Figure 3B:
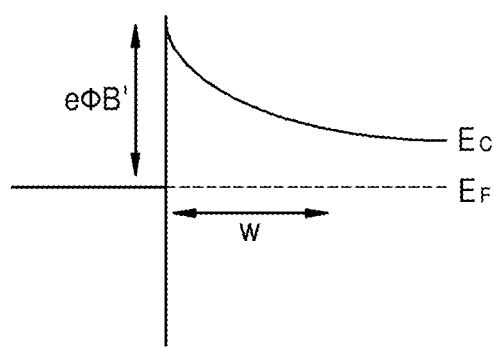
FIG. 3B illustrates a band diagram in the structure of FIG. 3A.

FIG. 2A illustrates a structure in which a metal layer 30' is separated from a semiconductor layer 70', e.g., an n-type silicon (n-Si) layer, and FIG. 2B illustrates a band diagram in the structure of FIG. 2A. FIG. 3A illustrates a structure in which the metal layer 30' is junctioned, adjoined or coupled to the semiconductor layer 70', e.g., the n-Si layer, and FIG. 3B illustrates a band diagram in the structure of FIG. 3A. In FIG. 2B, FIG. 3B, and the other drawings, $E_C$ denotes a conduction band energy level of the semiconductor layer 70', $E_V$ denotes a valence band energy level of the semiconductor layer 70', $E_F$ denotes a Fermi level of the semiconductor layer 70'. In addition, in FIG. 3B and the drawings below, each of w and w' denotes a depletion width.

As illustrated in FIGS. 2A and 2B, the metal layer 30' and the semiconductor layer 70' have different magnitudes of energy barriers eφm and eφB.

When the metal layer 30' and the semiconductor layer 70' are junctioned as shown in FIG. 3A, a work function of a metal and a Fermi level $E_F$ of a semiconductor match each other, thereby resulting in a Schottky energy barrier.

However, in general, when two materials are junctioned, by a Fermi level being fixed to a particular value on a semiconductor interface, i.e., by Fermi-level pinning, a greater Schottky energy barrier eφB' than expected is formed, as illustrated in FIG. 3B.

That is, as illustrated in the comparison between FIG. 2B and FIG. 3B, when the metal layer 30' and the semiconductor layer 70' are junctioned, the Schottky energy barrier eφB' is greater than the energy barrier eφB of the semiconductor layer 70'.

In general semiconductor processes, in order to improve such a problem where a Schottky energy barrier increases, the depletion width is reduced through implantation on the metal-semiconductor (e.g., silicon) interface to thereby allow electrons to pass easily through the Schottky energy barrier.

Figure 4A:
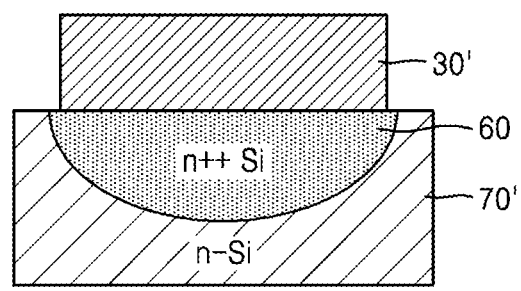
FIG. 4A illustrates a structure in which a doping region is formed through implantation on an interface at which the metal layer is junctioned, adjoined or coupled to the semiconductor layer, e.g., the n-Si layer.
Figure 4B:
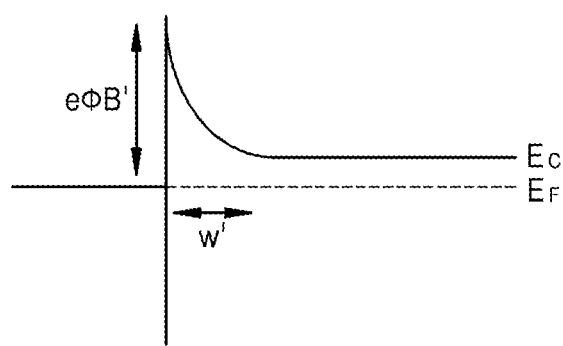
FIG. 4B illustrates a band diagram in the structure of FIG. 4A.

FIG. 4A illustrates a structure in which a doping region 60 is formed through implantation on an interface at which the metal layer 30' is junctioned, adjoined or coupled to the semiconductor layer 70', e.g., the n-Si layer, and FIG. 4B illustrates a band diagram in the structure of FIG. 4A, according to at least one example embodiment.

As shown in FIG. 4A, when the doping region 60 is formed in the semiconductor layer 70', a depletion width may be reduced from w to w' as shown from the comparison between FIG. 3B and FIG. 4B.

However, even though the doping region 60 is formed through implantation on a metal-semiconductor (e.g., silicon) interface, the magnitude of the Schottky energy barrier eφB' is rarely changed.

Figure 5A:
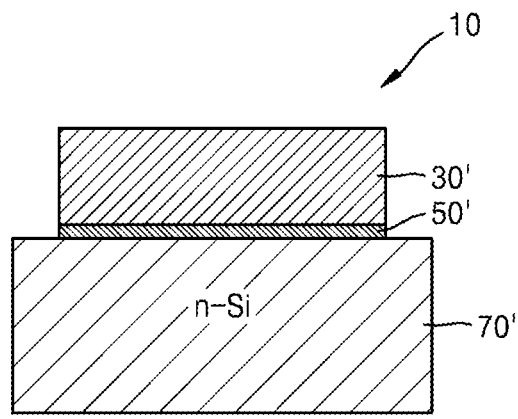
FIG. 5A illustrates a structure in which the metal layer is junctioned, adjoined or coupled to the semiconductor layer, e.g., the n-Si layer, by interposing a tunneling layer using a two-dimensional (2D) material therebetween, according to at least one example embodiment.
Figure 5B:
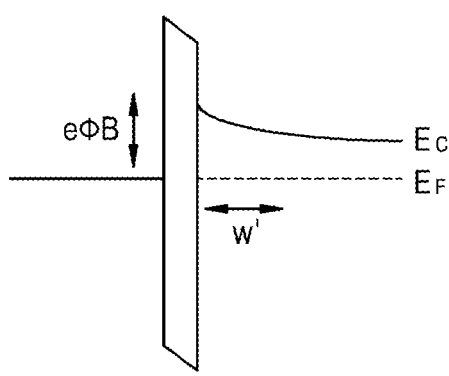
FIG. 5B illustrates a band diagram in the structure of FIG. 5A.

Referring to FIGS. 5A and 5B, as in the electronic device 10 according to an example embodiment, when the metal layer 30' and the semiconductor layer 70', e.g., the n-Si layer, are junctioned by interposing a tunneling layer 50' including a 2D material therebetween, the direct junction between a metal and a semiconductor may be prevented, and simultaneously, electrons may move by passing through the thin tunneling barrier 50'.

FIG. 5A illustrates a structure in which the metal layer 30' is junctioned to the semiconductor layer 70', e.g., the n-Si layer, by interposing the tunneling layer 50' using a 2D material therebetween, and FIG. 5B illustrates a band diagram in the structure of FIG. 5A.

As illustrated in FIG. 5B, when the metal layer 30' and the semiconductor layer 70', e.g., the n-Si layer, are junctioned by interposing a tunneling layer 50' using a 2D material therebetween, a Fermi-level pinning effect generated on a metal-semiconductor interface may be removed using the 2D material.

Therefore, as in the electronic device 10 according to an example embodiment, when a metal layer and a semiconductor layer are junctioned by interposing a tunneling layer including a 2D material therebetween, an ohmic contact between a semiconductor and a metal, e.g., between silicon and the metal, may be achieved without any additional implantation process.

According to the electronic device 10 according to an example embodiment, problems where a leakage current or short channel effect in a junction occur when doping a generally used semiconductor, e.g., silicon, increases in order to reduce the magnitude of the Schottky energy barrier may be improved.

In addition, as described above, by providing a tunneling layer using a 2D material between a metal and a semiconductor, a Fermi-level pinning effect may be changed, and a structure capable of passing electrons through a thin 2D material may be formed, and thus, a low-resistance metal-semiconductor junction may be implemented. Accordingly, additional doping having opposite polarity to a channel may not have to be performed in a portion where the metal and the semiconductor meet, e.g., in source and drain regions, and the source and drain regions may be sufficient with a much lower doping density, e.g., $10^{19}$ cm$^{-3}$ or less, than the doping density required in existing metal-semiconductor junctions.

As an example embodiment of the electronic device 10, a transistor to which a semiconductor-2D material-metal laminated structure is applied will now be described.

Figure 6:
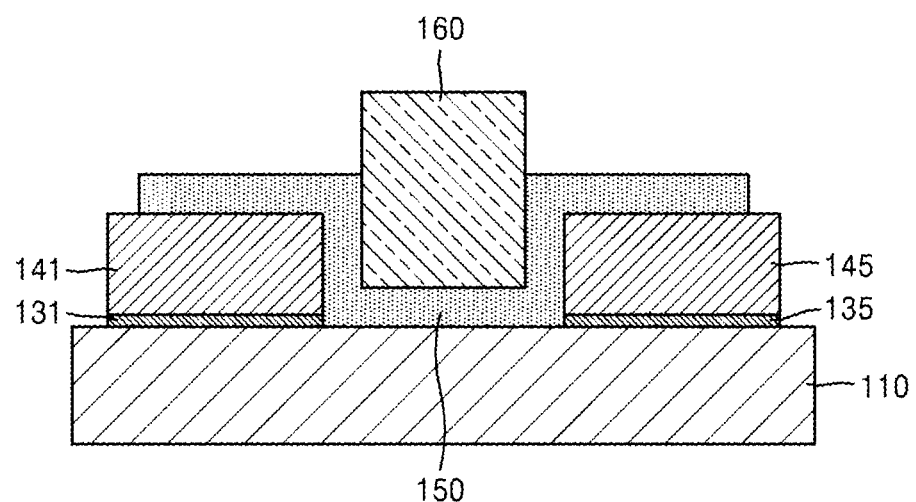
FIG. 6 is a schematic cross-sectional view of a transistor according to an example embodiment.

FIG. 6 is a schematic cross-sectional view of a transistor according to an example embodiment.

Referring to FIG. 6, the transistor according to an example embodiment may include a semiconductor layer 110, first and second tunneling layers 131 and 135 formed on the semiconductor layer 110, a source electrode 141 and a drain electrode 145 respectively formed on the first and second tunneling layers 131 and 135, and a gate electrode 160 located so as to face a channel region. The transistor may further include a gate insulating layer 150 located between the channel region and the gate electrode 160. FIG. 6 illustratively shows a top-gate type in which the gate electrode 160 is formed on the semiconductor layer 110, but when the semiconductor layer 110 is a layer stacked on a semiconductor substrate (not shown), the transistor according to an example embodiment may be configured as a bottom-gate type in which the gate electrode 160 is formed under the semiconductor layer 110. Hereinafter, the top-gate type is described as an example for convenience of description.

The semiconductor layer 110 may be a semiconductor substrate or may be a semiconductor layer formed on a semiconductor substrate (not shown). The semiconductor layer 110 may include at least one of, for example, silicon, germanium, silicon-germanium, II-VI group semiconductors, and III-V group semiconductors.

The semiconductor layer 110 may include the channel region, and a source region and a drain region which are separated from each other. The source region and the drain region may correspond to portions of the semiconductor layer 110 contacting the first and second tunneling layers 131 and 135, respectively. A portion of the semiconductor layer 110 between the source region and the drain region of the semiconductor layer 110, which faces the gate electrode 160, may correspond to the channel region.

The semiconductor layer 110 may have, for example, a uniform doping density. Some or all of the semiconductor layer 110 may be, for example, relatively weakly doped in an n-type. For example, the semiconductor layer 110 may be a relatively weakly doped n-type silicon layer or silicon substrate.

The uniform doping density of the semiconductor layer 110 indicates that additional doping is not performed for the source region and the drain region, and the source region and the drain region have the same or a similar doping density as the channel region.

As another example, the semiconductor layer 110 may be formed so that a portion of the source region and the drain region has a doping density that is $10^{19}$ cm$^{-3}$ or less. In this case, the channel region has a doping density that is different from the doping density of the source region and the drain region. That is, the source region and the drain region may have a doping density that is different from the doping density of other regions of the semiconductor layer 110. When the source region and the drain region have a doping density that is $10^{19}$ cm$^{-3}$ or less, a depletion width in the source region and the drain region may be reduced to about 3 nm or less.

As described above, the source region and the drain region included in the semiconductor layer 110 may be formed so as to have the same or a similar doping density as the channel region or to have a doping density that is $10^{19}$ cm$^{-3}$ or less.

The first and second tunneling layers 131 and 135 may be formed so as to directly contact the source region and the drain region in the semiconductor layer 110.

The first and second tunneling layers 131 and 135 may be formed of a 2D material so as to allow electrons to pass therethrough.

For example, the first and second tunneling layers 131 and 135 may be formed of a 2D laminated transition metal chalcogenide nanosheet. The first and second tunneling layers 131 and 135 may include at least one layer of a plate-shaped structure material including a combination of at least one of Ti, Zr, Hf, V, Nb, Ta, Mo, W, Tc, Re, Co, Rh, Ir, Ni, Pd, and Pt, and at least one of S, Se, and Te.

The first and second tunneling layers 131 and 135 may include at least one layer of a plate-shaped structure material including a hexagonal boron nitride (h-BN).

The source electrode 141 and the drain electrode 145 may be metal electrodes and may be respectively formed on the first and second tunneling layers 131 and 135. The source electrode 141 and the drain electrode 145 may be formed of a metal, a metal alloy, a conductive metal oxide, a conductive metal nitride or the like usable as a metal electrode. For example, the source electrode 141 and the drain electrode 145 may include at least one of Al, Au, Ag, Be, Bi, Co, Cu, Hf, In, Mn, Mo, Ni, Pb, Pd, Pt, Rh, Re, Ru, Ta, Te, Ti, W, Zn, and Zr. The source electrode 141 and the drain electrode 145 may be formed by depositing such material(s) on the first and second tunneling layers 131 and 135 in a single-layer or multi-layer structure.

The gate insulating layer 150 may be formed on the semiconductor layer 110 and between the source electrode 141 and the drain electrode 145, and the gate electrode 160 may be formed on the gate insulating layer 150. That is, the gate insulating layer 150 may be formed between the gate electrode 160 and the channel region. The gate insulating layer 150 may be formed of an oxide, e.g., hafnium dioxide ($HfO_2$), but various types of oxides may be applied thereto. The gate insulating layer 150 may be formed of various insulating materials besides the oxides. The gate electrode 160 may be formed of the same or a similar material as the source electrode 141 and the drain electrode 145. The gate electrode 160 may be formed of a different type of a metal or a metallic material from the source electrode 141 and the drain electrode 145.

As described above, according to the example transistor having a semiconductor-2D material-metal stacked structure in which the first and second tunneling layers 131 and 135 are formed between the source electrode 141 and the source region and between the drain electrode 145 and the drain region, respectively, when the 2D material is junctioned to the semiconductor, pinning may be changed. Accordingly, a Schottky energy barrier between the metal and the semiconductor may be removed or reduced, thereby resulting in an ohmic contact between the semiconductor, e.g., silicon, and the metal.

That is, the transistor according to an example embodiment may be implemented as a device having a low-resistance metal-semiconductor junction since an energy barrier is lowered using a 2D material instead of opposite-polar additional doping to the channel region in the source and drain regions.

The transistor according to an example embodiment may be miniaturized since a driving voltage may be reduced due to a decrease in a contact resistance and the size of an electrode region may be reduced due to the decrease in the contact resistance.

Furthermore, since high-density doping does not have to be performed in the source region and the drain region to lower the Schottky energy barrier, even though the size of a device is miniaturized, a short channel effect may be prevented such that a channel does not form well because doping portions of the source region and the drain region may meet each other.

As described above, according to the electronic device and the transistor according to the one or more of the example embodiments, the Fermi-level pinning of a semiconductor may be changed to allow current to flow well by using a 2D material, and a metal-semiconductor junction having a low resistance may be formed in a structure capable of passing electrons through a thin 2D material, thereby resulting in a device having a low-resistance metal-semiconductor junction.

It should be understood that the example embodiments described therein should be considered in a descriptive sense only and not for purposes of limitation. Descriptions of features or aspects within each example embodiment should typically be considered as available for other similar features in other example embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. An electronic device comprising:
    a semiconductor layer;
    a tunneling layer including a two-dimensional (2D) material directly contacting a certain region of the semiconductor layer; and
    a metal layer formed on the tunneling layer and in direct contact with the tunneling layer;
    the semiconductor layer having a doping density that is $10^{19}$ cm$^{-3}$ or less only in the certain region.

2. The electronic device of claim 1, wherein the tunneling layer includes the 2D material configured to pass electrons therethrough.

3. The electronic device of claim 1, wherein the tunneling layer includes a 2D laminated transition metal chalcogenide nanosheet.

4. The electronic device of claim 1, wherein the tunneling layer comprises at least one layer of a plate-shaped structure material including a combination of at least one of titanium (Ti), zirconium (Zr), hafnium (Hf), vanadium (V), niobium (Nb), tantalum (Ta), molybdenum (Mo), tungsten (W), technetium (Tc), rhenium (Re), cobalt (Co), rhodium (Rh), iridium (Ir), nickel (Ni), palladium (Pd), and platinum (Pt), and at least one of sulfur (S), selenium (Se), and tellurium (Te).

5. The electronic device of claim 1, wherein the tunneling layer comprises at least one layer of a plate-shaped structure material including a hexagonal boron nitride (h-BN).

6. The electronic device of claim 1, wherein the tunneling layer comprises a dopant capable of changing a Fermi level of a plate-shaped structure material.

7. The electronic device of claim 1, wherein the semiconductor layer comprises a semiconductor substrate.

8. The electronic device of claim 1, wherein the semiconductor layer comprises at least one of silicon, germanium, silicon-germanium, II-VI group semiconductors, and III-V group semiconductors.

* * * * *